US010999932B2

(12) United States Patent
Takano et al.

(10) Patent No.: US 10,999,932 B2
(45) Date of Patent: May 4, 2021

(54) ELECTRONIC PACKAGE INCLUDING CAVITY DEFINED BY RESIN AND METHOD OF FORMING SAME

(71) Applicant: SKYWORKS FILTER SOLUTIONS JAPAN CO., LTD., Kadoma (JP)

(72) Inventors: Atsushi Takano, Kadoma (JP); Mitsuhiro Furukawa, Nishinomiya (JP); Ichiro Kameyama, Katano (JP); Tetsuya Uebayashi, Ibaraki (JP)

(73) Assignee: SKYWORKS FILTER SOLUTIONS JAPAN CO., LTD., Kadoma (JP)

( * ) Notice: Subject to any disclaimer, the term of this patent is extended or adjusted under 35 U.S.C. 154(b) by 19 days.

(21) Appl. No.: 16/389,598

(22) Filed: Apr. 19, 2019

(65) Prior Publication Data

US 2019/0246500 A1    Aug. 8, 2019

Related U.S. Application Data

(62) Division of application No. 15/472,453, filed on Mar. 29, 2017, now Pat. No. 10,321,572.

(Continued)

(51) Int. Cl.
*H05K 1/18* (2006.01)
*H03H 9/05* (2006.01)
(Continued)

(52) U.S. Cl.
CPC ......... *H05K 1/181* (2013.01); *H01L 23/3135* (2013.01); *H03H 9/059* (2013.01);
(Continued)

(58) Field of Classification Search
CPC ........ H05K 1/181; H05K 1/111; H05K 3/303; H01L 23/3135; H03H 9/0523; H03H 9/059; H03H 9/1042; H03H 9/1085
See application file for complete search history.

(56) References Cited

U.S. PATENT DOCUMENTS 6,078,123 A     6/2000   Tanaka et al.
6,417,026 B2 *  7/2002   Gotoh ................. H01L 23/3135
                                                257/E23.126

(Continued)

FOREIGN PATENT DOCUMENTS

| JP | H05-90885 A | 4/1993 |
|---|---|---|
| JP | H1167830 A | 3/1999 |
| JP | H11251866 A | 9/1999 |
| JP | 2006217226 A | 8/2006 |

*Primary Examiner* — Charles D Garber
*Assistant Examiner* — S M Sohel Imtiaz
(74) *Attorney, Agent, or Firm* — Lando & Anastasi, LLP

(57) ABSTRACT

A method of manufacturing an electronic device includes preparing an electronic component including a first substrate on a main surface of which a functional unit and a first resin layer are formed. The first resin layer has a first surface facing the main surface of the first substrate, a second surface opposed to the first surface, a cavity on the first surface enclosing the functional unit, and a portion defining a wall of the cavity. The first resin layer defines a recess provided with a solder layer on the second surface. The method further includes preparing a second substrate having an electrode pad formed on a main surface, aligning the electronic component with the second substrate to layer the solder layer and the electrode pad in contact with the solder layer, and forming the electronic component and the second substrate into the electronic device.

19 Claims, 7 Drawing Sheets

Related U.S. Application Data

(60) Provisional application No. 62/317,234, filed on Apr. 1, 2016.

(51) Int. Cl.
  H03H 9/10 (2006.01)
  H01L 23/31 (2006.01)
  H03H 9/17 (2006.01)
  H03H 9/25 (2006.01)
  H05K 1/11 (2006.01)
  H05K 3/30 (2006.01)

(52) U.S. Cl.
  CPC ........ H03H 9/0523 (2013.01); H03H 9/1042 (2013.01); H03H 9/1085 (2013.01); H03H 9/17 (2013.01); H03H 9/25 (2013.01); H05K 1/111 (2013.01); H05K 3/303 (2013.01); *H01L 2224/16225* (2013.01); *H01L 2924/181* (2013.01); *H05K 2201/10068* (2013.01)

(56) References Cited

U.S. PATENT DOCUMENTS

| | | | |
|---|---|---|---|
| 2004/0209387 A1* | 10/2004 | Hong | H03H 3/08 438/27 |
| 2006/0022768 A1* | 2/2006 | Yokota | H03H 9/02984 333/133 |
| 2008/0220196 A1* | 9/2008 | Ukei | C09J 7/38 428/41.8 |
| 2009/0026589 A1* | 1/2009 | Kuramoto | H01L 21/56 257/666 |
| 2010/0052473 A1* | 3/2010 | Kimura | H03H 9/1092 310/313 R |
| 2012/0228762 A1* | 9/2012 | Fukuda | H01L 21/563 257/737 |
| 2013/0286611 A1* | 10/2013 | Droz | G06K 19/0723 361/760 |
| 2014/0182918 A1* | 7/2014 | Ogawa | H01L 23/3121 174/262 |
| 2018/0084633 A1* | 3/2018 | Rosenbauer | H05K 3/22 |

* cited by examiner

ELECTRONIC PACKAGE INCLUDING CAVITY DEFINED BY RESIN AND METHOD OF FORMING SAME

CROSS-REFERENCE TO RELATED APPLICATIONS

This application claims the benefit under 35 U.S.C. § 121 as a division of co-pending U.S. patent application Ser. No. 15/472,453, titled "ELECTRONIC PACKAGE INCLUDING CAVITY DEFINED BY RESIN AND METHOD OF FORMING SAME," filed on Mar. 29, 2017, issued as U.S. Pat. No. 10,321,572 on Jun. 11, 2019, which in turn claims the benefit under 35 U.S.C. § 119(e) of U.S. Provisional Application No. 62/317,234, titled "ELECTRONIC PACKAGE INCLUDING CAVITY DEFINED BY RESIN AND METHOD OF FORMING SAME," filed on Apr. 1, 2016. Each of these applications is herein incorporated by reference in its entirety for all purposes.

BACKGROUND

FIG. 1 is a cross-sectional view schematically showing a structure of a conventional electronic component 70 including a hollow or cavity sealing structure for a MEMS (Microelectromechanical System) device. The electronic component 70 includes a substrate or board 71 having a surface on which a functional unit, such as a SAW element including an interdigital transducer (IDT) electrode 72 and the like can be formed. A cavity 80 is formed on the substrate 71 to cover the functional unit. The lateral surface of the cavity 80 is defined by a metal layer 75 and the top surface thereof is defined by a foil 76. The metal layer 75 and the foil 76 are covered with a copper plating layer 77. The copper plating layer 77 is covered with a first resin layer 78. Solder bumps 79 are disposed on a surface of the electronic component and connected to the copper plating layer 77.

FIG. 2 is a cross-sectional view showing a package in which the electronic component 70 is mounted on a printed circuit board 86 and sealed with a second resin layer 89. The electronic component 70 is mounted face-down for welding the solder bump 79 to an electrode pad 87 disposed on the main surface 86a of the printed circuit board 86. After the welding, the solder bump 79 forms a solder layer 83. The electronic component 70 is then sealed with the second resin layer 89 by transfer molding or compression molding. The sealed and packaged electronic component 70 can be used as an electronic device.

The process of transfer molding or compression molding may apply an external pressure onto the electronic component 70 that may press the surface of the substrate 71. Accordingly, the copper plating layer 77 is formed in a shell structure to tolerate the external pressure and maintain the cavity 80. The copper plating layer 77 has a thickness of, for example, 30 µm to maintain the shell structure. The first resin layer 78 has a thickness of, for example, 30 µm and a gap having a thickness of, for example, 60 µm is provided to solder connect the electronic component 70 to the printed circuit board 86. The solder connection is applied between the solder layer 83 and the electrode pad 87.

Japanese Patent Application Publication No. JPH05-90885A discloses a technology for face-down mounting of a SAW element by which a functional surface of the SAW element is opposed to the circuit board on which it is mounted. According to this technology, the SAW element is connected and secured to a circuit board via an annular member formed of silicone resin or the like of a certain thickness to establish a space for the oscillation of the SAW element, and the element is then potted with resin. U.S. Pat. No. 6,417,026 discloses a technology by which a chip device is mounted face-down on a mounting substrate provided with bump electrodes and the chip device is sealed and protected with resin. A protection layer covering the space above an active region of the chip device and an insulating layer enclosing the active region are formed for preventing the resin from flowing into a gap between the chip device and the mounting substrate. The technologies disclosed in these references are directed to a resin potting process and do not include a process of transfer molding or compression molding that is commonly performed under high temperature and pressure.

SUMMARY

Aspects and embodiments disclosed herein relate to a packaged electronic component including a hollow structure for a MEMS (Microelectromechanical System) device such as a surface acoustic wave (SAW) element or a film bulk acoustic resonator (FBAR) including a mechanically movable portion, an electronic device and the electronic component, and manufacturing methods thereof.

The conventional electronic component 70 shown in FIGS. 1 and 2 requires working processes for forming a shell structure of the copper plating layer 77. The need for forming the copper plating layer 77 may limit the flexibility for designing the conventional electronic component 70 and may cause a floating capacitance to be exhibited between the copper plating layer 77 and electrodes formed on the substrate 71.

Aspects and embodiments disclosed herein provide an electronic component, an electronic device, and manufacturing methods thereof for enabling a resin packaging by a process of transfer molding or compression molding without a shell structure including a copper plating layer.

An electronic component according to a first aspect may include a substrate including a main surface, a functional unit formed on the main surface of the substrate, and a resin layer formed on the main surface of the substrate, the resin layer including a first surface facing the main surface of the substrate and a second surface opposed to the first surface, the resin layer including a cavity on the first surface enclosing the functional unit, the resin layer defining a recess on the second surface, and a solder layer disposed in the recess, the solder layer not exceeding the second surface in a thickness direction.

In some embodiments, the functional unit may include one of a SAW element or a FBAR having a mechanically movable portion. The substrate may be formed of dielectric material. The resin layer may be provided with a through hole extending from the recess and passing through the resin layer to the main surface. A metal layer may be disposed in the through hole and electrically may connect the solder layer to the main surface.

An electronic device according to another aspect comprises an electronic component including a first substrate having a functional unit formed on a main surface of the first substrate and a first resin layer formed on the main surface thereof, the first resin layer having a first surface facing the main surface of the first substrate and a second surface opposed to the first surface, the first resin layer including a cavity on the first surface enclosing the functional unit, the first resin layer defining a recess on the second surface, a second substrate having an electrode pad formed on a main surface thereof, a solder layer disposed in the recess in contact with the electrode pad, the solder layer and the electrode pad having a combined thickness corresponding to a distance between the main surface of the first substrate and the main surface of the second substrate, and a second resin layer sealing the electronic component and the second substrate.

In some embodiments, the functional unit includes one of a SAW element or a FBAR having a mechanically movable portion. The first substrate may be formed of dielectric material. The first surface may be in contact with the main surface of the first substrate. The second surface may be in contact with the main surface of the second substrate. The second resin layer may be in contact with the first substrate, the first resin layer, and the second substrate.

A method of manufacturing an electronic device according to another aspect may include preparing an electronic component including a first substrate on a main surface of which a functional unit and a first resin layer are formed, the first resin layer having a first surface facing the main surface of the first substrate and a second surface opposed to the first surface, the first resin layer including a cavity on the first surface enclosing the functional unit, the first resin layer defining a recess on the second surface, the recess being provided with a solder layer, preparing a second substrate having an electrode pad formed on a main surface of the second substrate, aligning the electronic component with the second substrate, aligning the electronic component to the second substrate including layering the solder layer and the electrode pad in contact with the solder layer to have a combined thickness corresponding to a distance between the main surface of the first substrate and the main surface of the second substrate in the recess, and forming the electronic component and the second substrate into the electronic device.

In some embodiments, forming the electronic component and the second substrate into the electronic device may include sealing the electronic component and the second substrate with a second resin layer. Sealing the electronic component and the second substrate with a second resin layer may be performed by transfer molding or compression molding. Forming the electronic component and the second substrate into the electronic device may include welding the solder layer onto the electrode pad. Welding the solder layer onto the electrode pad may further include cooling the solder layer. A gap between the second surface of the first resin layer and the main surface of the second substrate may be minimized to be less than a size of a filler dispersed in a material of the second resin layer.

A method of manufacturing an electronic component according to another aspect may include forming a functional unit on a main surface of a substrate, forming a resin layer on the main surface, the resin layer having a first surface facing the main surface and a second surface opposed to the first surface, forming a cavity enclosing the functional unit by the first surface, forming a recess on the second surface, and forming a solder layer in the recess so as not to exceed the second surface in a thickness direction.

In some embodiments, the cavity is defined by the resin layer.

In some embodiments, forming the resin layer includes forming a dam portion extending from the second surface of the resin layer.

In accordance with aspects and embodiments disclosed herein, the shell structure of the copper plating layer for tolerating a pressure applied by transfer molding or compression molding may be eliminated such that the flexibility for designing the component may be ensured. Further, there may be no need to consider the floating capacitance between the copper plating layer and electrodes formed on the substrate. Still further, working processes for forming the copper plating layer may be eliminated.

DETAILED DESCRIPTION

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Aspects and embodiments directed to an electronic component, an electronic device, and manufacturing methods thereof will now be described with reference to the accompanying drawings. Although a SAW element is illustrated as an example of a MEMS device, the present disclosure is not limited to the SAW element but can be applied to a FBAR and other MEMS devices.

Figure 3:
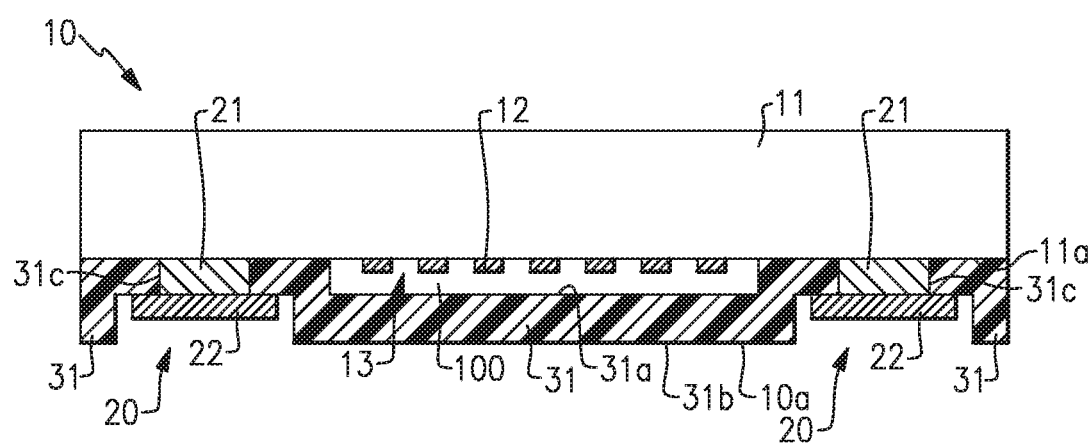
FIG. 3 is a cross-sectional view of an electronic component according to aspects of the present disclosure.

FIG. 3 is a cross-sectional view schematically showing an electronic component 10 according to aspects of the present disclosure. The electronic component 10 includes a substrate 11 formed of dielectric material. A functional unit 13 such as a SAW element is formed on a main surface 11a of the substrate 11. The functional unit 13 includes a mechanically movable portion having an IDT electrode 12, a SAW propagation path (not shown), and the like. The dielectric material of the substrate 11 may include a piezoelectric single crystal such as lithium tantalate or lithium niobate.

A cavity 100 is formed on the main surface 11a of the substrate 11 to cover the functional unit 13. The cavity 100 is defined between the main surface 11a and a first surface 31a of a first resin layer 31 having a certain thickness. The cavity 100 provides for the mechanically movable portion to properly operate in the functional unit 13. The first resin layer 31 is formed of thermoset resin material, for example, polyimide or epoxy, in which inorganic fillers, for example, silica and/or alumina may be dispersed.

The first resin layer 31 has a flat second surface 31b in parallel with the main surface 11a of the substrate 11. The second surface 31b is provided with a plurality of recesses 20. Each recess 20 has a certain depth and may define an internal cylindrical surface having a certain diameter. In some embodiments, the diameter of the recess 20 may be configured to accommodate an electrode pad of a printed circuit board as described below. Further, when the substrate 11 is formed as rectangular, a recess 20 may be positioned around each of the four corners.

It is to be appreciated that the second surface 31b of the first resin layer 31 corresponds to a bottom surface 10a of the electronic component 10. The second surface 31b of the first resin layer 31 is also referred to as a bottom surface 10a of the electronic component 10 hereinafter.

The recess 20 is provided with a solder layer 22. The solder layer 22 has a thickness such that the solder layer 22 does not extend beyond the second surface 31b of the first resin layer 31 in the thickness direction of the first resin layer 31. This is so the recess 20 may accommodate an electrode pad 53 formed on a printed circuit board 51 as described below (see FIG. 4). The solder layer 22 may have a cylindrical shape, the diameter of which is configured to correspond to that of the cylindrical shape of the recess 20. There may be a gap provided between the periphery of the solder layer 22 and a peripheral surface defining the recess 20.

The first resin layer 31 is provided with through holes 31c extending from the main surface 11a of the substrate 11 to the solder layer 22. Each through hole 31c is disposed at a location corresponding to the recess 20. Each through hole 31c is provided with a metal layer 21. The metal layer 21 electrically connects the solder layer 22 to wiring (not shown) connected to the functional unit 13 formed on the main surface 11a.

Figure 1:
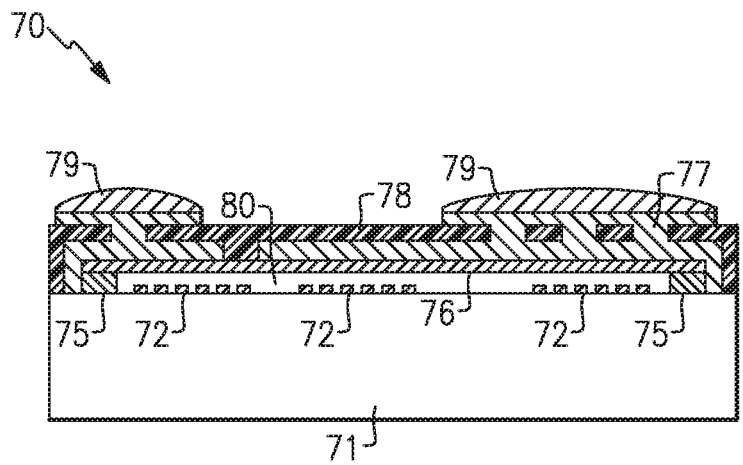
FIG. 1 is a cross-sectional view of a conventional electronic component.
Figure 2:
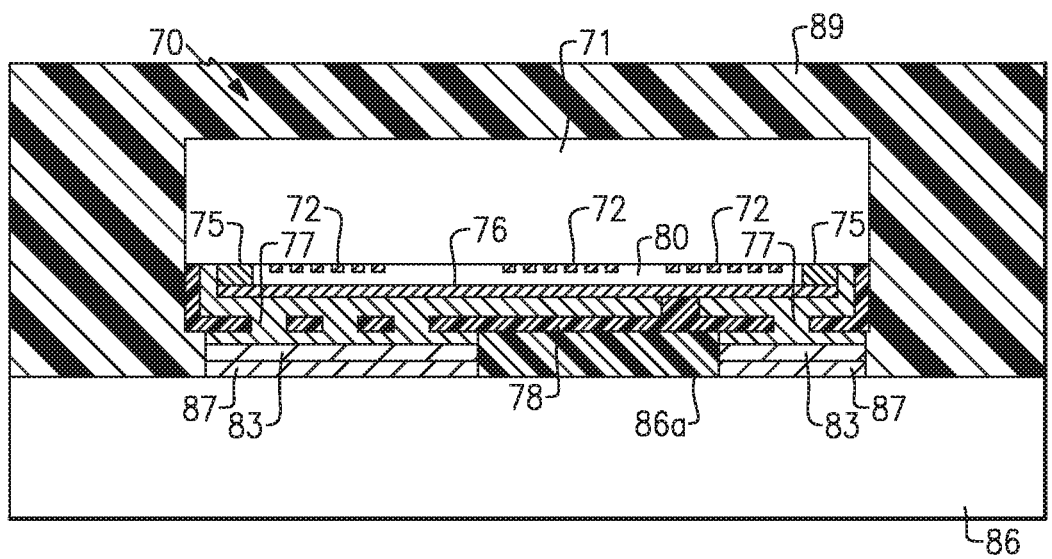
FIG. 2 is a cross-sectional view of a resin-packaged electronic component.

The electronic component 10 is different from the conventional electronic component as shown in FIGS. 1 and 2 in that there is no shell structure formed by the copper plating layer 77. Therefore, the flexibility for designing the component may be improved and working processes for forming the copper plating layer 77 may be eliminated. Further, there may be no need to consider the floating capacitance between the copper plating layer 77 and IDT electrodes 72 formed on the substrate 71.

Figure 4:
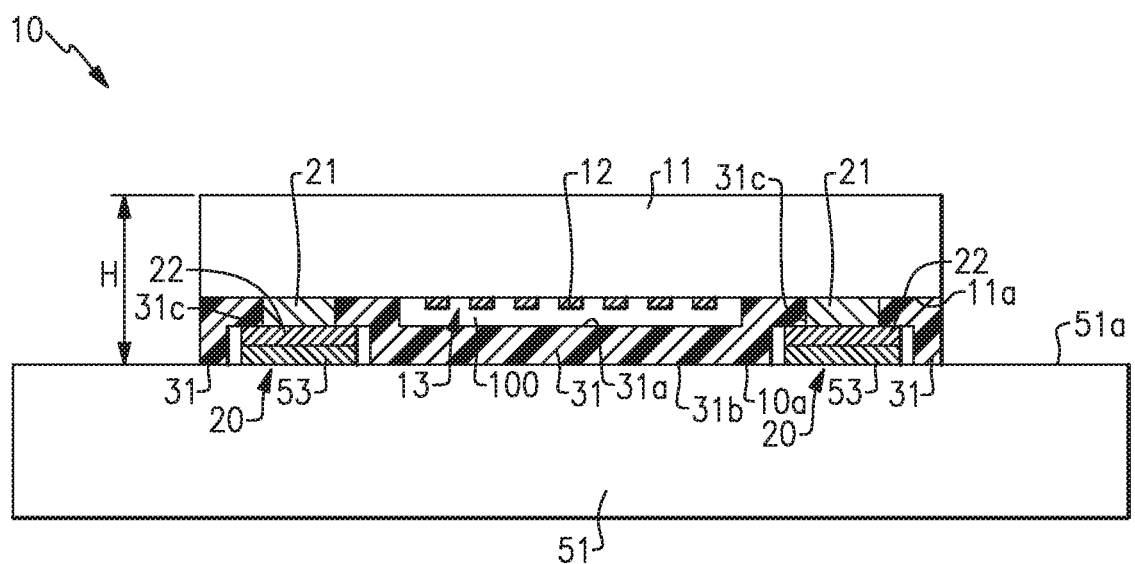
FIG. 4 is a cross-sectional view of the electronic component implemented on a printed circuit board.

FIG. 4 is a cross-sectional view of the electronic component 10 mounted on a printed circuit board 51. The printed circuit board 51 includes a flat main surface 51a. The main surface 51a is provided with electrode pads 53, each of which is disposed at a location corresponding to a recess 20 of the electronic component 10. The electronic component 10 is positioned such that a corresponding electrode pad 53 can be accommodated in each respective recess 20. The solder layer 22 formed in the recess 20 is welded onto the electrode pad 53. It is to be appreciated that the solder layer 22 may have a thickness sufficient to provide an amount of solder necessary to be used for the welding onto the electrode pad 53.

Welding between the solder layer 22 and the electrode pad 53 is performed by heating the electronic component 10 and the printed circuit board 51 up to a certain temperature, maintaining the temperature for a certain duration of time, and melting the solder layer 22. The solder layer 22 and the electrode pad 53 are welded, and then the electronic component 10 and the printed circuit board 51 are cooled. At the time of cooling, the melted solder layer 22 contracts in volume due to the solidification.

The volume contraction may apply a contraction force between the solder layer 22 and the electrode pad 53 when the solder layer 22 is welded and secured onto the electrode pad 53. Accordingly, the bottom surface 10a of the electronic component 10 and the main surface 51a of the printed circuit board 51 are pressure bonded to each other. Consequently, the gap between the bottom surface 10a of the electronic component 10 and the main surface 51a of the printed circuit board 51 can be significantly reduced.

The bottom surface 10a of the electronic component 10 is tightly connected to the main surface 51a of the printed circuit board 51 due to the contraction force applied between the solder layer 22 and the electrode pad 53 such that the first resin layer 31 forming the cavity 100 can be supported substantially entirely by the printed circuit board 51. Therefore, there is no need to provide the copper plating layer 77 as shown in FIGS. 1 and 2 for protecting the cavity 80 from the external pressure applied by transfer molding or compression molding.

Further, there is no need to provide a gap between the electronic component 10 and the printed circuit board 51 for the solder connection. As a result, compared to the conventional electronic component 70 implemented as shown in FIG. 2, the thickness of 30 μm for the copper plating layer 77, the thickness of 30 μm for the first resin layer 78, and the gap of 60 μm for the solder connection between the printed circuit board 86 and the electronic component 70 can be eliminated. Therefore, as shown in FIG. 4 for example, a height H of the electronic component 10 implemented on the printed circuit board 51 can be reduced by 120 μm in total as compared to the conventional electronic component of FIG. 2.

It is to be appreciated that, in order to correspond to the linear expansion coefficient of the electronic component 10, the printed circuit board 51 may have a linear expansion coefficient less than an FR4 printed circuit board commonly used, for example, 10 ppm/° C. or less. In addition, in terms of the reliability, the correspondence of linear expansion coefficient between the printed circuit board 51 and the electronic component 10 can prevent detachment between the solder layer 22 and the electrode pad 53 caused by heating and cooling processes.

Figure 5:
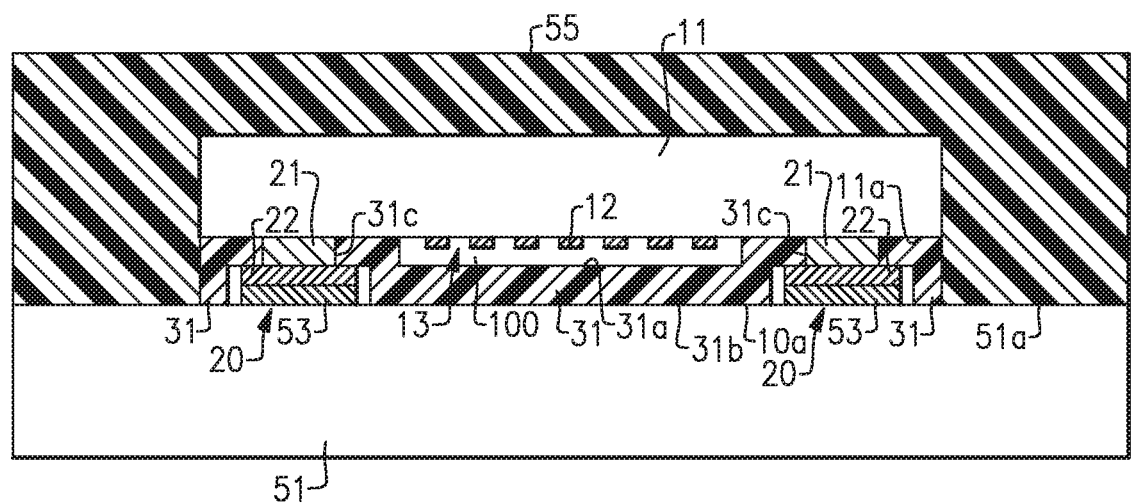
FIG. 5 is a cross-sectional view showing an electronic device resin-packaged with a second resin layer to cover a printed circuit board on which an electronic component is implemented.

FIG. 5 is a cross-sectional view showing an electronic device 50 obtained by mounting the electronic component 10 on the printed circuit board 51 and then resin sealing the same with a second resin layer 55. The second resin layer 55 is formed by transfer molding or compression molding under a temperature of 150° C. or greater and a pressure between 50 and 100 MPa. The second resin layer 55 is formed of thermoset resin material, for example, polyimide or epoxy, in which inorganic fillers, for example, silica and/or alumina may be dispersed.

The electronic component 10 has a bottom surface 10a that can be pressure bonded to the main surface 51a of the printed circuit board 51 by a contraction force created when the solder layer 22 is welded onto the electrode pad 53. Therefore, the gap between the bottom surface 10a of the electronic component 10 and the main surface 51a of the printed circuit board 51 can be significantly reduced such that the resin of the second resin layer 55 can be prevented from penetrating into the gap even under the pressure applied by transfer molding or compression molding.

For example, if the gap between the bottom surface 10a of the electronic component 10 and the main surface 51a of the printed circuit board 51 is less than the size of a filler dispersed in the resin material of the second resin layer 55, it would be impossible for the resin material to penetrate into such a gap. In addition, if the resin material of the second resin layer 55 has a thixotropic index higher than a certain value in a resin sealing process for the second resin layer 55, it would be impossible for the resin material to penetrate into such a gap. Therefore, the fillers dispersed in the second resin layer 55 may have an average size of 10 μm or greater. Further, in order to increase the thixotropic index, the content of the fillers may be 65 percent by weight or greater.

In some embodiments, the second resin layer 55 is formed by transfer molding or compression molding. Therefore, the transfer molding or compression molding that can realize a packaging process via a robust and stable resin sealing process may protect the electronic device 50 including the substrate 11 and the electronic component 10.

Figure 6:
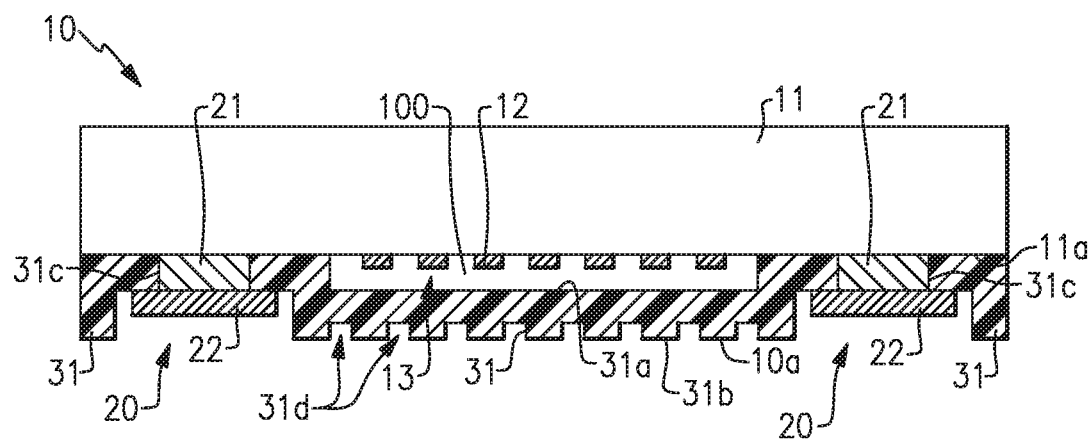
FIG. 6 is a cross-sectional view of an electronic component according to a first alternative embodiment.

FIG. 6 is a cross-sectional view showing a configuration of an electronic component 10 according to a first alternative embodiment. The electronic component 10 of the first alternative embodiment is similar to that of the previous embodiment except that a plurality of grooves 31d spaced apart in a certain distance from one another and each having a certain depth are applied on the second surface 31b of the first resin layer 31, i.e., the bottom surface 10a of the electronic component 10. Since the first alternative embodiment is substantially the same as the previous embodiment, like reference numerals for the electronic component 10 of the previous embodiment are used to refer to like elements of the first alternative embodiment.

According to the first alternative embodiment, the bottom surface 10a of the electronic component 10 is formed in concavo-convex shape with the grooves 31d. This may allow the bottom surface 10a of the electronic component 10 to be easily and flexibly deformed such that the adhesiveness between the bottom surface 10a and the main surface 51a of the printed circuit board 51 on which the electronic component 10 is mounted can be improved. Therefore, the resin of the second resin layer 55 can be prevented from penetrating into the gap between areas including the grooves 31d on the bottom surface 10a of the electronic component 10 and the main surface 51a of the printed circuit board 51 even under the pressure applied by transfer molding or compression molding.

Figure 7:
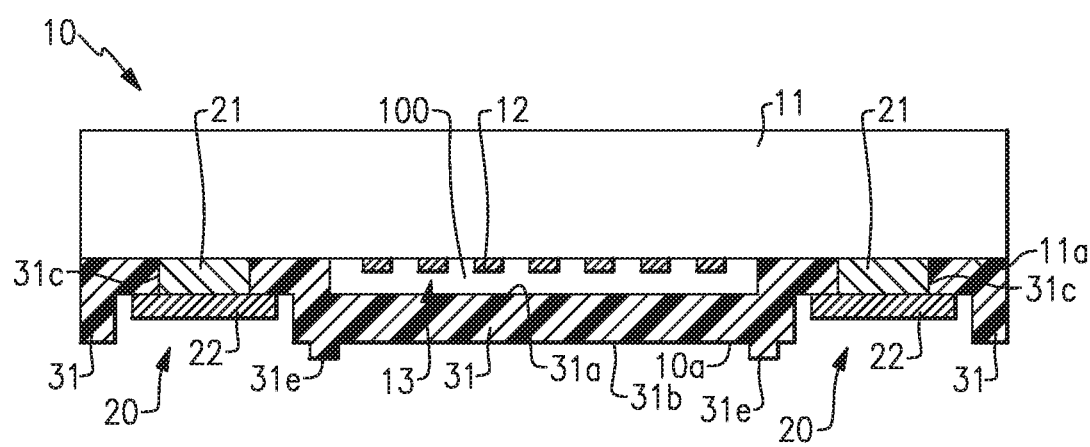
FIG. 7 is a cross-sectional view of an electronic component according to a second alternative embodiment.

FIG. 7 is a cross-sectional view showing an electronic component 10 according to a second alternative embodiment. The electronic component 10 of the second alternative embodiment is similar to that of the previous embodiments except that dam portions 31e each having a protrusion of a certain height and a certain width are formed near the recesses 20 on the second surface 31b of the first resin layer 31, i.e., the bottom surface 10a of the electronic component 10. A dam portion 31e can be formed at a location enclosing the cavity 100 or the recesses 20 on the bottom surface 10a. Since the second alternative embodiment is substantially the same as the previous embodiments, like reference numerals for the electronic component 10 of the previous embodiments are used to refer to like elements of the second alternative embodiment.

According to the second alternative embodiment, dam portion or portions 31e having a certain width and a certain height are formed near the recesses 20 on the bottom surface 10a of the electronic component 10. The dam portion or portions 31e may reduce the area in contact with the main surface 51a of the printed circuit board 51 on which the electronic component 10 is mounted such that the contact pressure can increase to facilitate the adhesiveness. Therefore, the resin of the second resin layer 55 can be prevented from penetrating into the gap between areas including the dam portions 31e on the bottom surface 10a of the electronic component 10 and the main surface 51a of the printed circuit board 51 even under the pressure applied by transfer molding or compression molding.

Figure 8A:
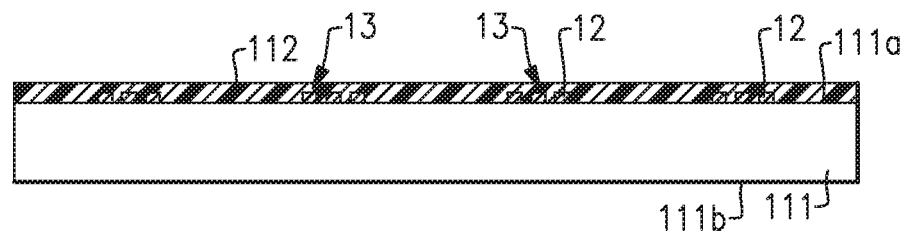
FIGS. 8A-8I illustrate a series of processes in a method of manufacturing an electronic component.
Figure 8B:
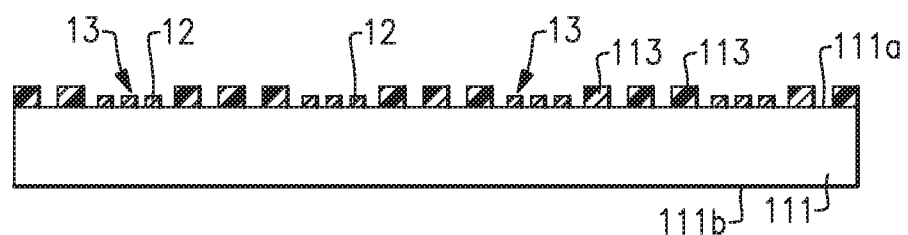

FIGS. 8A to 8I illustrate a series of processes of a method of manufacturing an electronic component 10. As shown in FIG. 8A, a plurality of functional units 13 each including an IDT electrode 12 are formed on the main surface 111a of a substrate 111 formed of dielectric material, and then a thin film 112 having a certain thickness is formed on the functional units 13 and main surface 111a of the substrate 111 by a material that may also be used to form the first resin layer 31. Next, a resist is applied onto the thin film 112 and then the resist is exposed, developed, and etched via a mask such that, as shown in FIG. 8B, lateral walls 113 are formed to enclose the functional unit 13. The lateral walls 113 are to be covered with the first resin layer 31 to define a cavity 100 (see FIG. 2).

Figure 8C:
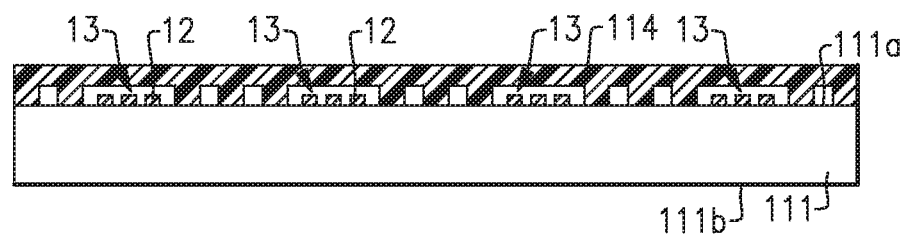
Figure 8D:
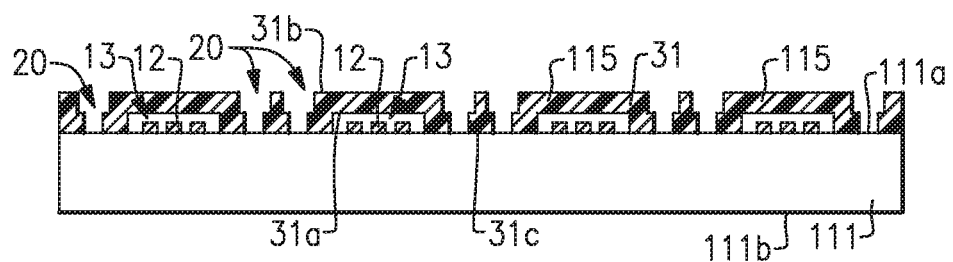

As shown in FIG. 8C, a thin film 114 having a certain thickness is formed on the lateral walls 113 with a material constituting the first resin layer 31 such that the cavity 100 is defined by the main surface 111a, the lateral walls 113, and the thin film 114 as shown in FIG. 5. Next, a resist is applied onto the thin film 114 and then the resist is exposed, developed, and etched via a mask such that, as shown in FIG. 8D, a ceiling portion 115 for a cavity is formed to cover the functional units 13 in the first resin layer 31. Accordingly, the lateral wall 113 and the ceiling portion 115 for the cavity are defined in the first resin layer 31. Therefore, the first resin layer 31 includes a first surface 31a corresponding to the ceiling portion 115 and a second surface 31b opposed to the first surface 31a. In addition, the first resin layer 31 includes recesses 20 opening to the second surface 31b and islands 31c extending between the recesses 20 and the main surface 111a of the substrate 111.

Figure 8E:
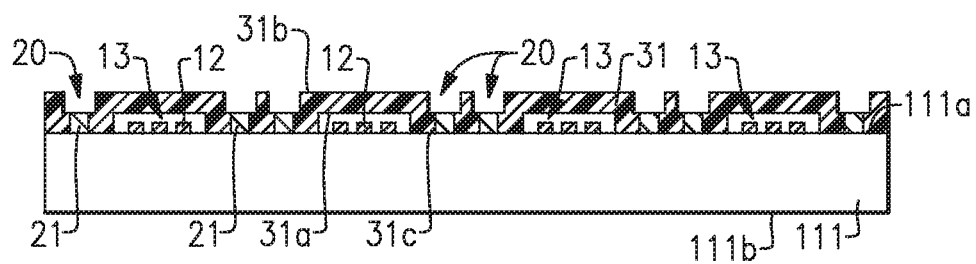
Figure 8F:
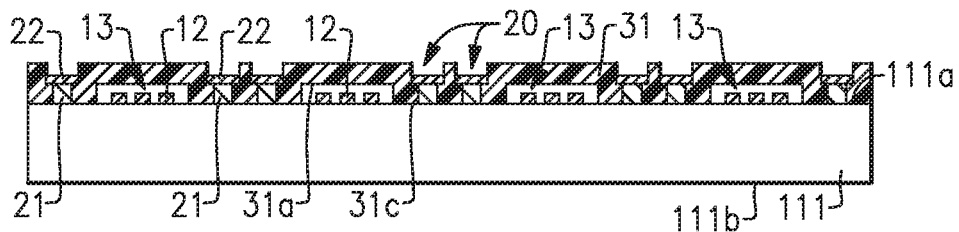

As shown in FIG. 8E, metal layers 21 are formed in the through recesses 20 of the first resin layer 31 by a plating process. The metal layers 21 may include copper. Next, as shown in FIG. 8F, solder layers 22 are formed by a plating process in the recesses 20 on the metal layers 21. The plating process can more precisely control the height of solder when forming the solder layers 22 than could a printing process, by which the solder layers 22 could alternatively be formed.

Figure 8G:
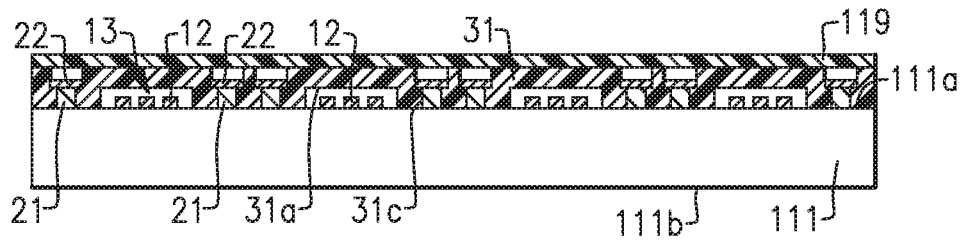
Figure 8H:
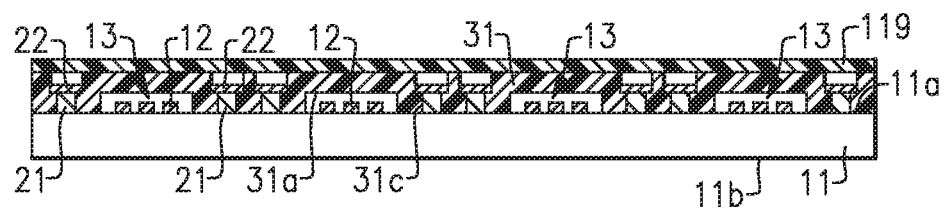

As shown in FIG. 8G, a back-grinding tape 119 is adhered onto the first resin layer 31 formed on the main surface 111a of the substrate 111 to protect the first resin layer 31 from a polishing process. Next, the polishing process is performed on a surface 111b opposed to the main surface 111a of the substrate 111 until the substrate 111 is thinned to a certain thickness as shown in FIG. 8H. In the polishing process, the back-grinding tape 119 protects structural components including the functional units 13 formed on the main surface 111a of the substrate 111. After the polishing process is finished, the back-grinding tape 119 is removed.

Figure 8I:
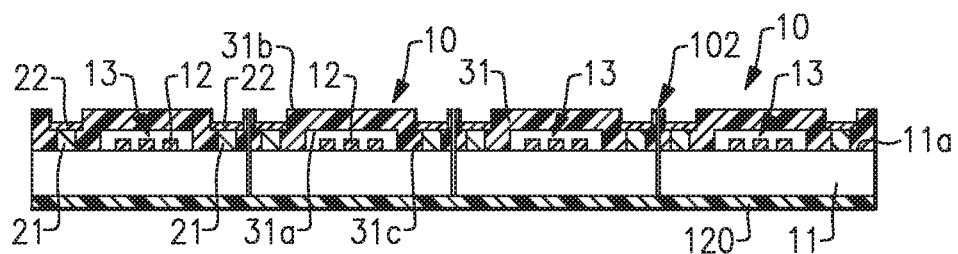

As shown in FIG. 8I, a dicing tape 120 is adhered to a surface 11b opposed to the main surface 11a of the substrate 11 and then the substrate 11 is diced into electronic components 10. The dicing process may provide singulated embodiments of the electronic component 10.

Although embodiments of the electronic component 10 can be manufactured by the aforementioned series of processes, these processes are directed merely to an example of the manufacturing method of the electronic component 10. Further, an electronic device 50 as shown in FIG. 5 can be provided by removing the dicing tape 120 from the electronic component 10 diced as shown in FIG. 8I, positioning and securing the electronic component 10 on a main surface 51a of a printed circuit board 50, and forming a second resin layer 55 by transfer molding or compression molding.

Figure 9:
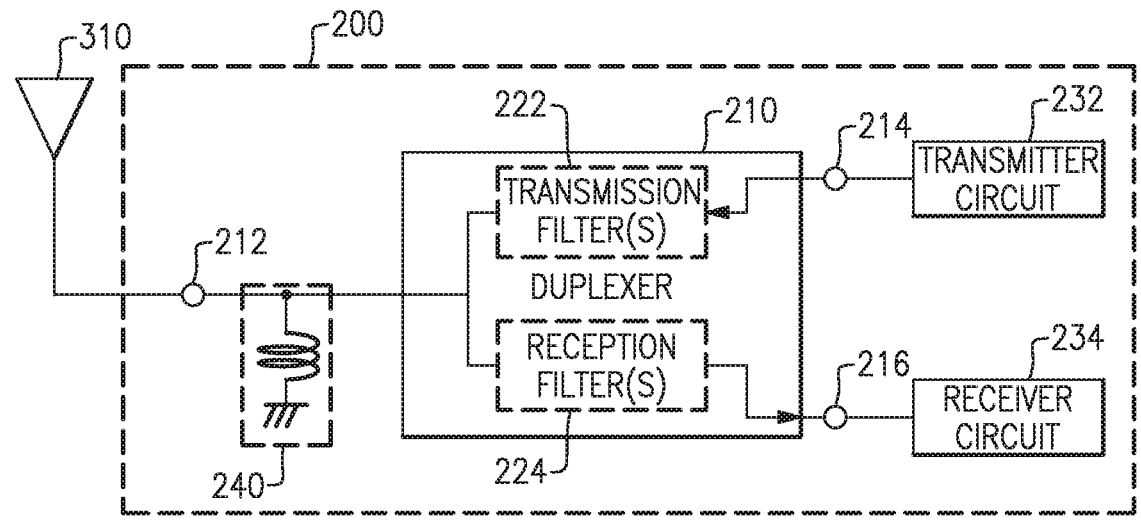
FIG. 9 is a block diagram of an example of a module which may be used in an electronic device.

Referring to FIG. 9, there is illustrated a block diagram of one example of a front-end module 200, which may be used in an electronic device such as a wireless communications device (e.g., a mobile phone) for example. The front-end module 200 includes an antenna duplexer 210 having a common node 212, an input node 214, and an output node 216. An antenna 310 is connected to the common node 212. The front-end module 200 further includes a transmitter circuit 232 connected to the input node 214 of the duplexer 210 and a receiver circuit 234 connected to the output node 216 of the duplexer 210. The transmitter circuit 232 can generate signals for transmission via the antenna 310, and the receiver circuit 234 can receive and process signals received via the antenna 310. In some embodiments, the receiver and transmitter circuits are implemented as separate components, as shown in FIG. 9, however in other embodiments these components may be integrated into a common transceiver circuit or module. As will be appreciated by those skilled in the art, the front-end module 200 may include other components that are not illustrated in FIG. 9 including, but not limited to, switches, electromagnetic couplers, amplifiers, processors, and the like.

The antenna duplexer 210 may include one or more transmission filters 222 connected between the input node 214 and the common node 212, and one or more reception filters 224 connected between the common node 212 and the output node 216. The passband(s) of the transmission filter(s) are different from the passband(s) of the reception filters. Each of the transmission filter(s) 222 and the reception filter(s) 224 may include an embodiment of an electronic component 10 as disclosed herein. An inductor or other matching component 240 may be connected at the common node 212.

In certain examples, the SAW elements used in the transmission filter 222 or the reception filter 224 are disposed on a single piezoelectric substrate. This structure reduces the effect of changes in temperature upon the frequency responses of the respective filter, in particular, reducing degradation in the passing or attenuation characteristics due to changes in the temperature, because each SAW element changes similarly in response to changes in the ambient temperature. In addition, this arrangement may also allow the transmission filter 222 or reception filter 224 to have a small size.

Figure 10:
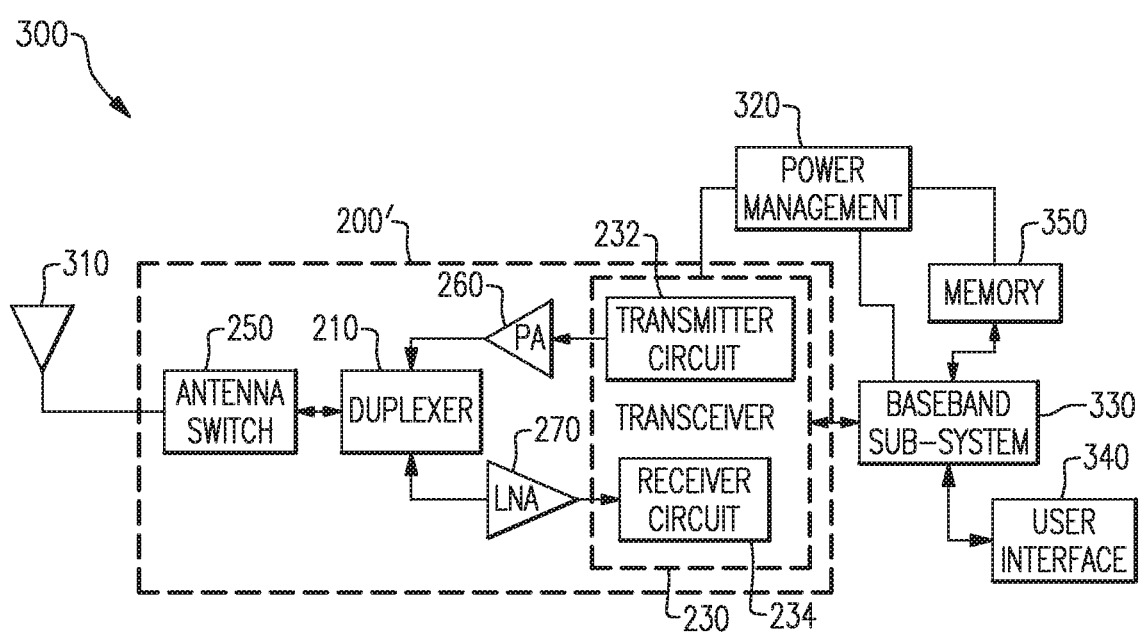
FIG. 10 is a block diagram of an embodiment of a wireless device.

FIG. 10 is a block diagram of one example of a wireless device 300 including the antenna duplexer 210 shown in FIG. 9. The wireless device 300 can be a cellular phone, smart phone, tablet, modem, communication network or any other portable or non-portable device configured for voice or data communication. The wireless device 300 can receive and transmit signals from the antenna 310. The wireless device includes an embodiment of a front-end module 200' similar to that discussed above with reference to FIG. 9. The front-end module 200' includes the duplexer 210, as discussed above. In the example shown in FIG. 10 the front-end module 200' further includes an antenna switch 250, which can be configured to switch between different frequency bands or modes, such as transmit and receive modes, for example. In the example illustrated in FIG. 10, the antenna switch 250 is positioned between the duplexer 210 and the antenna 310; however, in other examples the duplexer 210 can be positioned between the antenna switch 250 and the antenna 310. In other examples the antenna switch 250 and the duplexer 210 can be integrated into a single component.

The front end module 200' includes a transceiver 230 that is configured to generate signals for transmission or to process received signals. The transceiver 230 can include the transmitter circuit 232, which can be connected to the input node 214 of the duplexer 210, and the receiver circuit 234, which can be connected to the output node 216 of the duplexer 210, as shown in the example of FIG. 9.

Signals generated for transmission by the transmitter circuit 232 are received by a power amplifier (PA) module 260, which amplifies the generated signals from the transceiver 230. The power amplifier module 260 can include one or more power amplifiers. The power amplifier module 260 can be used to amplify a wide variety of RF or other frequency-band transmission signals. For example, the power amplifier module 260 can receive an enable signal that can be used to pulse the output of the power amplifier to aid in transmitting a wireless local area network (WLAN) signal or any other suitable pulsed signal. The power amplifier module 260 can be configured to amplify any of a variety of types of signal, including, for example, a Global System for Mobile (GSM) signal, a code division multiple access (CDMA) signal, a W-CDMA signal, a Long Term Evolution (LTE) signal, or an EDGE signal. In certain embodiments, the power amplifier module 260 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 10, the front-end module 200' may further include a low noise amplifier module 270, which amplifies received signals from the antenna 310 and provides the amplified signals to the receiver circuit 234 of the transceiver 230.

The wireless device 300 of FIG. 10 further includes a power management sub-system 320 that is connected to the transceiver 230 and manages the power for the operation of the wireless device 300. The power management system 320 can also control the operation of a baseband sub-system 330 and various other components of the wireless device 300. The power management system 320 can include, or can be connected to, a battery (not shown) that supplies power for the various components of the wireless device 300. The power management system 320 can further include one or more processors or controllers that can control the transmission of signals, for example. In one embodiment, the baseband sub-system 330 is connected to a user interface 340 to facilitate various input and output of voice and/or data provided to and received from the user. The baseband sub-system 330 can also be connected to memory 350 that is configured to store data and/or instructions to facilitate the operation of the wireless device, and/or to provide storage of information for the user.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention.

What is claimed is:

1. A method of manufacturing an electronic device, the method comprising:

preparing an electronic component including a first substrate on a main surface of which a functional unit and a first resin layer are formed, the first resin layer having a first surface facing the main surface of the first substrate and a second surface opposed to the first surface, the first resin layer including a cavity on the first surface enclosing the functional unit, a portion of the first surface defining a wall of the cavity parallel to the main surface of the substrate, the first resin layer defining a recess on the second surface, the recess being provided with a solder layer;

forming a dam portion extending from the second surface of the first resin layer;

preparing a second substrate having an electrode pad formed on a main surface of the second substrate;

aligning the electronic component with the second substrate to layer the solder layer and the electrode pad in contact with the solder layer to have a combined thickness corresponding to a depth of the recess; and forming the electronic component and the second substrate into the electronic device.

2. The method of claim 1 wherein forming the electronic component and the second substrate into the electronic device includes sealing the electronic component and the second substrate with a second resin layer.

3. The method of claim 2 wherein sealing the electronic component and the second substrate with the second resin layer is performed by transfer molding.

4. The method of claim 2 wherein sealing the electronic component and the second substrate with the second resin layer is performed by compression molding.

5. The method of claim 2 wherein forming the electronic component and the second substrate into the electronic device includes welding the solder layer onto the electrode pad.

6. The method of claim 5 wherein welding the solder layer onto the electrode pad incudes melting the solder layer to be bonded to the electrode pad.

7. The method of claim 6 wherein welding the solder layer onto the electrode pad further includes cooling the solder layer.

8. The method of claim 7 wherein forming the electronic component and the second substrate into the electronic device includes bonding the electronic component to the second substrate with the first resin layer by pressure bonding with a compression force caused by volume contraction of the solder layer upon the cooling of the solder layer.

9. The method of claim 2 wherein a gap between the second surface of the first resin layer and the main surface of the second substrate is minimized to be less than a size of a filler dispersed in a material of the second resin layer.

10. The method of claim 1 wherein preparing the electronic component includes forming the solder layer within the recess, the solder layer not exceeding the second surface in a thickness direction.

11. The method of claim 1 wherein preparing the electronic component includes forming one of a surface acoustic wave element or a film bulk acoustic resonator having a mechanically moveable portion as the functional unit on the main surface of the first substrate.

12. The method of claim 1 further comprising selecting a substrate formed of a dielectric material as the first substrate.

13. The method of claim 12 further comprising selecting a substrate formed of a piezoelectric material as the first substrate.

14. The method of claim 1 further comprising forming a through hole in the resin layer extending from the recess and passing through the resin layer to the main surface of the first substrate.

15. The method of claim 14 further comprising electrically connecting the solder layer to the main surface with a metal layer distinct from the solder layer formed within the through hole, the metal layer, solder layer, and electrode pad having a combined thickness corresponding to a distance between the main surface of the first substrate and the main surface of the second substrate.

16. The method of claim 1 wherein preparing the electronic component includes forming the resin layer with the first surface in contact with the main surface of the first substrate.

17. The method of claim 1 wherein preparing the electronic component includes forming the resin layer with the second surface in contact with the main surface of the second substrate.

18. A method of manufacturing an electronic component, comprising:

forming a functional unit on a main surface of a substrate;

forming a resin layer on the main surface, the resin layer having a first surface facing the main surface and a second surface opposed to the first surface, forming the resin layer including forming a dam portion extending from the second surface of the resin layer;

forming a cavity enclosing the functional unit by the first surface, a portion of the first surface defining a wall of the cavity parallel to the main surface of the substrate;

forming a recess on the second surface; and forming a solder layer in the recess that does not exceed the second surface in a thickness direction.

19. The method of claim 18 wherein the cavity is defined by the resin layer.

* * * * *

UNITED STATES PATENT AND TRADEMARK OFFICE
CERTIFICATE OF CORRECTION

PATENT NO. : 10,999,932 B2  
APPLICATION NO. : 16/389598  
DATED : May 4, 2021  
INVENTOR(S) : Atsushi Takano et al.

Page 1 of 1

It is certified that error appears in the above-identified patent and that said Letters Patent is hereby corrected as shown below:

On the Title Page

(71) Applicant: delete "SKYWORKS FILTER SOLUTIONS JAPAN CO., LTD., Kadoma (JP)" and insert -- SKYWORKS FILTER SOLUTIONS JAPAN CO., LTD., Kadoma-Shi (JP) --

(72) Inventors: delete "Atsushi Takano, Kadoma (JP)" and insert -- Atsushi Takano, Kadoma-Shi (JP) --; delete "Mitsuhiro Furukawa, Nishinomiya (JP)" and insert -- Mitsuhiro Furukawa, Nishinomiya-Shi (JP) --; delete "Ichiro Kameyama, Katano (JP)" and insert -- Ichiro Kameyama, Katano-Shi (JP) --; delete "Tetsuya Uebayashi, Ibaraki (JP)" and insert -- Tetsuya Uebayashi, Ibaraki-Shi (JP) --

(73) Assignee: delete "SKYWORKS FILTER SOLUTIONS JAPAN CO., LTD., Kadoma (JP)" and insert -- SKYWORKS FILTER SOLUTIONS JAPAN CO., LTD., Kadoma-Shi (JP) --

Signed and Sealed this  
Fifteenth Day of June, 2021

Drew Hirshfeld  
*Performing the Functions and Duties of the*  
*Under Secretary of Commerce for Intellectual Property and*  
*Director of the United States Patent and Trademark Office*